United States Patent
Wada et al.

(10) Patent No.: US 11,043,508 B2
(45) Date of Patent: Jun. 22, 2021

(54) SEMICONDUCTOR INTEGRATED CIRCUIT DEVICE, CURRENT CONTROL DEVICE USING SEMICONDUCTOR INTEGRATED CIRCUIT DEVICE, AND AUTOMATIC TRANSMISSION CONTROL DEVICE USING CURRENT CONTROL DEVICE

(71) Applicant: HITACHI AUTOMOTIVE SYSTEMS, LTD., Hitachinaka (JP)

(72) Inventors: Shinichirou Wada, Tokyo (JP); Yoichiro Kobayashi, Hitachinaka (JP); Masato Kita, Hitachinaka (JP)

(73) Assignee: HITACHI AUTOMOTIVE SYSTEMS, LTD., Ibaraki (JP)

(*) Notice: Subject to any disclaimer, the term of this patent is extended or adjusted under 35 U.S.C. 154(b) by 0 days.

(21) Appl. No.: 16/970,645

(22) PCT Filed: Jan. 28, 2019

(86) PCT No.: PCT/JP2019/002640
§ 371 (c)(1),
(2) Date: Aug. 18, 2020

(87) PCT Pub. No.: WO2019/163417
PCT Pub. Date: Aug. 29, 2019

(65) Prior Publication Data
US 2020/0381454 A1 Dec. 3, 2020

(30) Foreign Application Priority Data
Feb. 26, 2018 (JP) .............................. JP2018-032560

(51) Int. Cl.
*H01L 27/12* (2006.01)
*H03K 17/687* (2006.01)
*G05F 3/26* (2006.01)

(52) U.S. Cl.
CPC .......... *H01L 27/1203* (2013.01); *G05F 3/262* (2013.01); *H03K 17/6871* (2013.01)

(58) Field of Classification Search
CPC .. H01L 27/1203; G05F 3/262; H03K 17/6871
(Continued)

(56) References Cited

U.S. PATENT DOCUMENTS 6,404,275 B1 * 6/2002 Voldman ................. G05F 3/262
327/538
6,713,817 B2 * 3/2004 Kitagawa ............ H01L 27/0629
257/360

(Continued)

FOREIGN PATENT DOCUMENTS

JP 2002-141421 A 5/2002
JP 2008-210902 A 9/2008
(Continued)

OTHER PUBLICATIONS

International Search Report, PCT/JP2019/002640, dated May 7, 2019, 1 pg.

*Primary Examiner* — Metasebia T Retebo
(74) *Attorney, Agent, or Firm* — Volpe Koenig

(57) ABSTRACT

A semiconductor device obtains high current ratio accuracy by eliminating an influence of plasma charging using a MOS-type transistor in which a channel region is isolated and separated from a semiconductor substrate. In a current mirror circuit in which both of a well of a NMOS-type transistor that generates a bias and a well of a NMOS-type transistor that receives the bias are formed insulated and separated from a semiconductor substrate, a connection circuit is connected between gate electrodes and wells of NMOS-type transistors without through the semiconductor substrate, and the connection circuit makes the gate electrodes and the wells in an electrically short-circuited state during manufacturing of the current mirror circuit, and
(Continued)

makes the gate electrodes and the wells in a disconnected state in at least one direction during a mounting operation.

11 Claims, 10 Drawing Sheets

(58) Field of Classification Search
USPC .......................................................... 257/369
See application file for complete search history.

(56) References Cited

U.S. PATENT DOCUMENTS

| | | |
|---|---|---|
| 2002/0063296 A1 | 5/2002 | Kitagawa et al. |
| 2008/0224737 A1* | 9/2008 | Minami ................. G05F 3/262 |
| | | 327/108 |
| 2014/0368957 A1 | 12/2014 | Kato |
| 2020/0401171 A1* | 12/2020 | Kanazawa .............. G05F 1/561 |

FOREIGN PATENT DOCUMENTS

| | | |
|---|---|---|
| JP | 2010-016210 A | 1/2010 |
| JP | 2014-241537 A | 12/2014 |

* cited by examiner

SEMICONDUCTOR INTEGRATED CIRCUIT DEVICE, CURRENT CONTROL DEVICE USING SEMICONDUCTOR INTEGRATED CIRCUIT DEVICE, AND AUTOMATIC TRANSMISSION CONTROL DEVICE USING CURRENT CONTROL DEVICE

TECHNICAL FIELD

The present invention relates to a semiconductor integrated circuit device, a current control device using the semiconductor integrated circuit device, and an automatic transmission control device using the current control device.

BACKGROUND ART

In manufacturing of a semiconductor integrated circuit device in which a MOS-type transistor is mounted, an electrical characteristic such as a threshold voltage or a gain (gm) of the MOS-type transistor is changed by a plasma charging stress of a wiring layer when dry etching for forming the wiring layer or insulating film deposition is performed. The phenomenon has a large influence particularly on an analog circuit having a differential pair configuration, such as an OP amplifier and a current mirror circuit. One cause of such a phenomenon is that, for example, a characteristic difference between a pair of transistors in the semiconductor integrated circuit device is amplified to generate a voltage or a current which is an output.

Therefore, as a countermeasure against such a phenomenon, for example, PTL 1 discloses a technique of connecting a diode, via a metal wiring as a first layer, to each gate electrode of a group of MOS-type transistors required to have the same characteristic in the current mirror circuit from each metal wiring to a power supply node (in a forward direction) and from a ground node to each metal wiring (in the forward direction).

CITATION LIST

Patent Literature

PTL 1: JP-A-2002-141421

SUMMARY OF INVENTION

Technical Problem

However, the inventors of the present application have newly found that the influence of the plasma charging in a wiring process is not only on the gate electrode but also on a channel region of the MOS-type transistor, which is insulated and separated from a semiconductor substrate. That is, the inventors of the present application have found that the channel region is charged due to the influence of the plasma, resulting in a potential difference between the gate electrode and the channel region, and accordingly the electrical characteristic of the MOS-type transistor changes. This causes the characteristic difference between the MOS-type transistors and a decrease in current ratio accuracy since in the current mirror circuit, charge amounts of the channel region connected to wirings formed separately are different and the influences of the plasma are different.

In the related-art technique described above, due to the influence of the plasma during manufacturing of the wiring layer, when each gate electrode is negatively charged, a charge is released from the diode connected from the ground node to each metal wiring (in the forward direction), and when each gate electrode is positively charged, the charge is released from the diode connected from each metal wiring to the power supply node (in the forward direction). However, in the related-art technique described above, the diode connected from the ground node to each metal wiring (in the forward direction) can be connected to a P-type well connected to the channel region, but when the diode connected from each metal wiring to the power supply node (in the forward direction) is connected to the P-type well, an NMOS-type transistor cannot be operated. That is, the influence of the plasma charging on each gate electrode has been considered, but the influence of the plasma charging on the channel region of the MOS-type transistor, which is insulated and separated from the semiconductor substrate, is not considered.

Further, in the related-art technique described above, there is also a problem that a desired effect cannot be expected for a charging stress in a manufacturing process before the metal wiring as the first layer is formed, that is, in a manufacturing plasma process of depositing an insulating film under the metal wiring or forming a contact that connects the metal wiring as the first layer and the transistor.

The invention has been made in view of the above, and an object of the invention is to provide a semiconductor integrated circuit device, a current control device using the semiconductor integrated circuit device, and an automatic transmission control device using the current control device which can obtain high current ratio accuracy by eliminating an influence of plasma charging for each gate electrode and each channel region of a transistor on a side where a bias is generated and a transistor on a side where the bias is received in a current mirror circuit using a MOS-type transistor in which the channel region is isolated and separated from a semiconductor substrate.

Solution to Problem

The present application includes a plurality of means for solving the above-described technical problems, and for example, a semiconductor integrated circuit device formed on a semiconductor substrate includes a current mirror circuit on which both of a well of a MOS-type transistor that generates a bias and a well of a MOS-type transistor that receives the bias are formed insulated and separated from the semiconductor substrate, and a connection circuit that is connected via a first wiring layer between a gate electrode and the well of the MOS-type transistor that generates the bias, and between a gate electrode and the well of the MOS-type transistor that receives the bias without through the semiconductor substrate, in which the connection circuit makes the gate electrode and the well in an electrically short-circuited state during manufacturing of the semiconductor integrated circuit device, and makes the gate electrode and the well in a disconnected state in at least one direction during a mounting operation.

Advantageous Effect

According to the invention, high current ratio accuracy can be obtained by eliminating an influence of plasma charging for each gate electrode and each channel region of a transistor on a side where the bias is generated and a transistor on a side where the bias is received in a current mirror circuit using a MOS-type transistor in which the channel region is isolated and separated from the semiconductor substrate.

DESCRIPTION OF EMBODIMENTS

Hereinafter, embodiments of the invention will be described with reference to the drawings.

First Embodiment

A first embodiment of the invention will be described with reference to FIG. 1.

Figure 1:
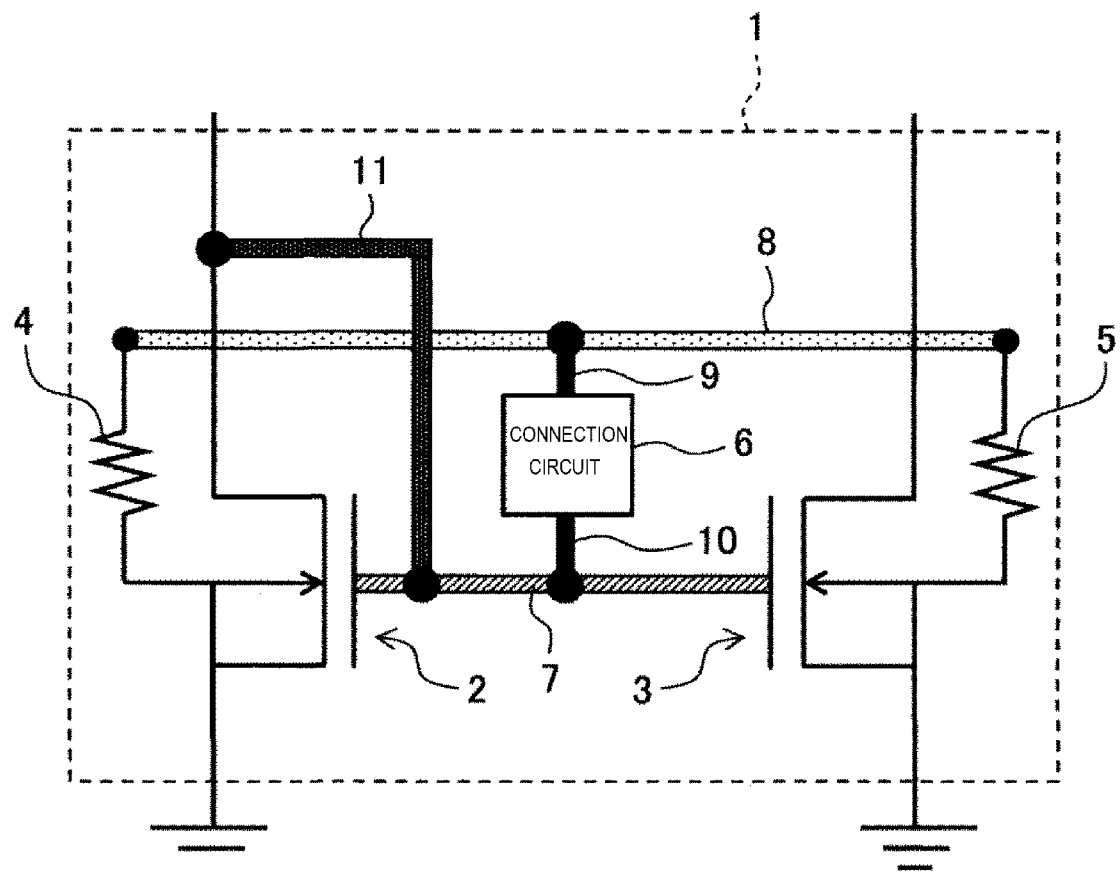
FIG. 1 is a circuit diagram showing an example of a semiconductor integrated circuit device according to a first embodiment.

FIG. 1 is a circuit diagram showing an example of a semiconductor integrated circuit device according to the present embodiment.

In FIG. 1, a current mirror circuit 1, which is the semiconductor integrated circuit device according to the present embodiment, includes an NMOS-type transistor 2 on a side where a bias is generated, and an NMOS-type transistor 3 on a side where the bias generated by the NMOS-type transistor 2 is received.

Gate electrodes of the NMOS-type transistors 2 and 3 are connected via a first connection line 7 formed below a first wiring layer, and wells thereof are connected via a second connection line 8 below the first wiring layer. Further, the gate electrode and a drain of the NMOS-type transistor 2 on the side where the bias is generated are connected via a connection line 11 formed in a second wiring layer above the first wiring layer. Resistances of the wells of the NMOS-type transistors 2 and 3 are indicated by P-well resistances 4 and 5 connected via the second connection line 8.

Since the current mirror circuit 1 which is the semiconductor integrated circuit device is formed from a lower layer side, an influence of plasma charging on each gate electrode connected via the first connection line 7 after a manufacturing process can be made equal between the NMOS-type transistors 2 and 3. Similarly, an influence of the plasma charging on each channel region connected via the second connection line 8 after the manufacturing process can be made equal between the NMOS-type transistors 2 and 3.

Further, the first connection line 7 is formed of a polysilicon layer forming the gate electrode, and the second connection line 8 is formed of a P-type semiconductor layer forming a P-well layer.

With this configuration, when a $SiO_2$ insulating film under the first wiring layer is deposited, for example, by a plasma CVD method, or when a contact hole is formed in the $SiO_2$ insulating film by a dry etching method to connect the first wiring layer and the transistor, since the gate electrodes of the NMOS-type transistors 2 and 3 are kept at the same potential and the channel regions thereof are also kept at the same potential, a voltage applied between the gate electrode and the channel region can be made equal, and the influence of the plasma charging can be made equal between the NMOS-type transistors 2 and 3.

Further, a connection circuit 6 is connected between the gate electrode and the well of the NMOS-type transistor 2 and between the gate electrode and the well of the NMOS-type transistor 3 that receives the bias via connection lines 9 and 10 formed in the first wiring layer without through a semiconductor substrate. That is, the first connection line 7 that connects the gate electrodes of the NMOS-type transistors 2 and 3 and the connection circuit 6 are connected via the connection line 10, and the second connection line 8 that connects the wells of the NMOS-type transistors 2 and 3 and the connection circuit 6 are connected via the connection line 9.

The connection circuit 6 makes the gate electrodes and the wells of the NMOS-type transistors 2 and 3 in an electrically short-circuited state during the manufacturing of the current mirror circuit 1 which is the semiconductor integrated circuit device, and makes the gate electrodes and the wells of the NMOS-type transistors 2 and 3 in a disconnected state in at least one direction during a mounting operation.

That is, with the connection circuit 6, the gate electrodes and the channel regions of the NMOS-type transistors 2 and 3 can be short-circuited or clamped at a constant voltage or less in a wiring plasma process during the manufacturing, and an electrical characteristic change of the NMOS-type transistors 2 and 3 can be controlled.

The operation and effect of the present embodiment configured as above will be described with reference to the drawings.

Figure 12:
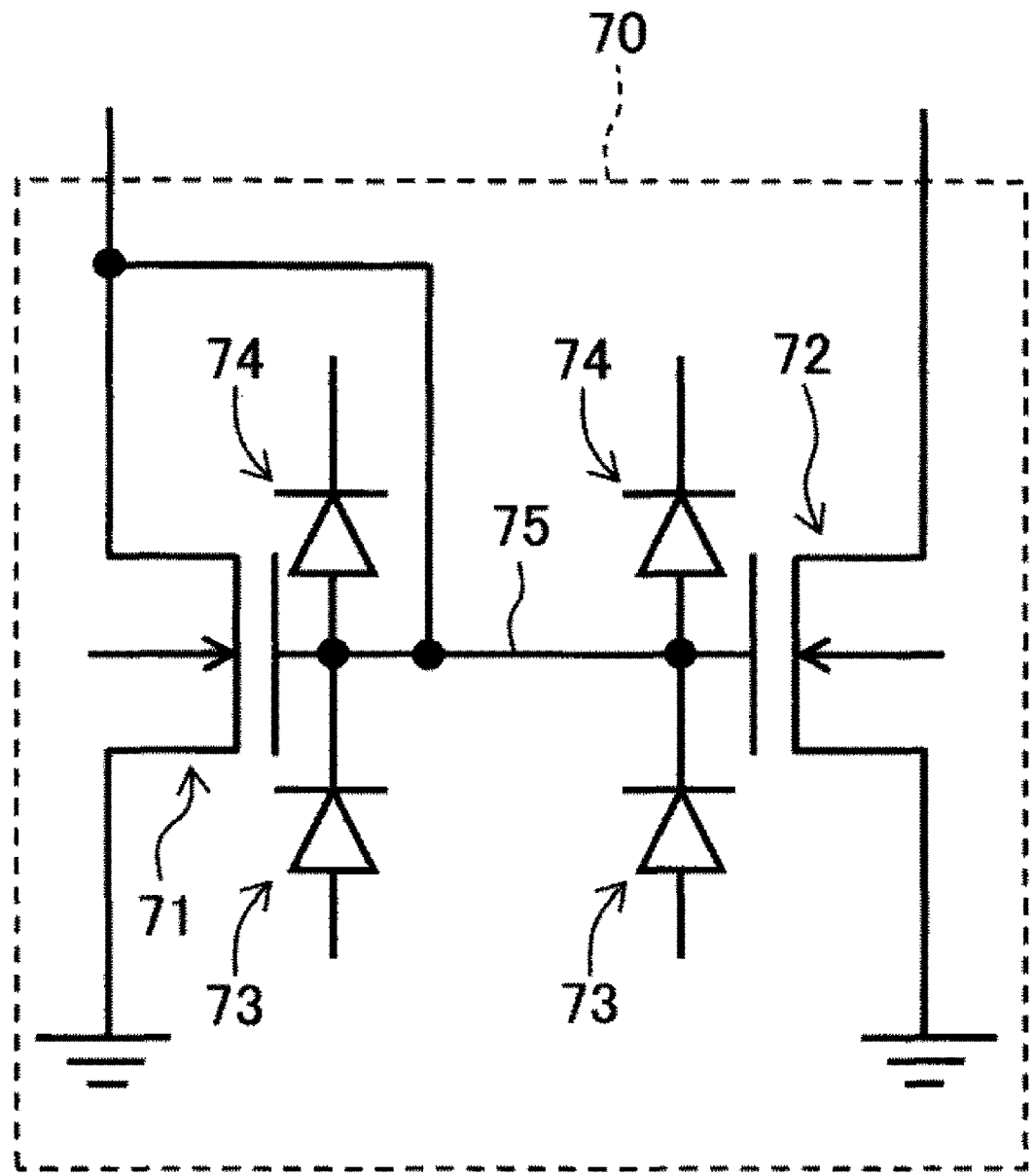
FIG. 12 is a diagram showing an overall configuration of a current mirror circuit in the related art.

FIG. 12 is a diagram showing an overall configuration of a current mirror circuit in the related art.

In FIG. 12, diodes 73 and 74 are connected to gate electrodes of MOS-type transistor groups 71 and 72 required to have same characteristics via a metal wiring 75 as a first layer. Due to the influence of the plasma during manufacturing of the wiring layer, when each gate electrode is negatively charged, charges are released from the diodes 73 and 73, and when each gate electrode is positively charged, charges are released from the diodes 74 and 74. Accordingly, even when charge amounts of the gate electrodes of a pair of MOS-type transistor groups 71 and 72 are different, it is possible to eliminate an influence of stress in the plasma process during the manufacturing. However, in the related-art technique described above, the influence of the plasma charging on each gate electrode has been considered, but the influence of the plasma charging on the channel region of the MOS-type transistor, which is insulated and separated from the semiconductor substrate, is not considered. That is, the diodes 73 and 73 can be connected to a P-type well connected to the channel region, but when the diodes 74 and 74 are connected to the P-type well, the MOS-type transistor groups 71 and 72 cannot be operated.

In contrast, in the present embodiment, the semiconductor integrated circuit device is formed on the semiconductor substrate, and includes the current mirror circuit 1 on which both of the well of the NMOS-type transistor 2 that generates the bias and the well of the NMOS-type transistor 3 that receives the bias are formed insulated and separated from the semiconductor substrate, and the connection circuit 6 that is connected via the first wiring layer between the gate electrode and the well of the NMOS-type transistor 2 that generates the bias, and between the gate electrode and the well of the NMOS-type transistor 3 that receives the bias without passing through the semiconductor substrate, and the connection circuit 6 makes the gate electrodes and the wells in an electrically short-circuited state during the manufacturing of the semiconductor integrated circuit device, and makes the gate electrodes and the wells in a disconnected state in at least one direction during a mounting operation. Therefore, high current ratio accuracy can be obtained by eliminating the influence of the plasma charging for each gate electrode and each channel region of the transistor on the side where the bias is generated and the transistor on the side where the bias is received in the current mirror circuit using the MOS-type transistor in which the channel region is isolated and separated from the semiconductor substrate.

Example 1

An example of the invention will be described with reference to FIGS. 2 to 5.

Figure 2:
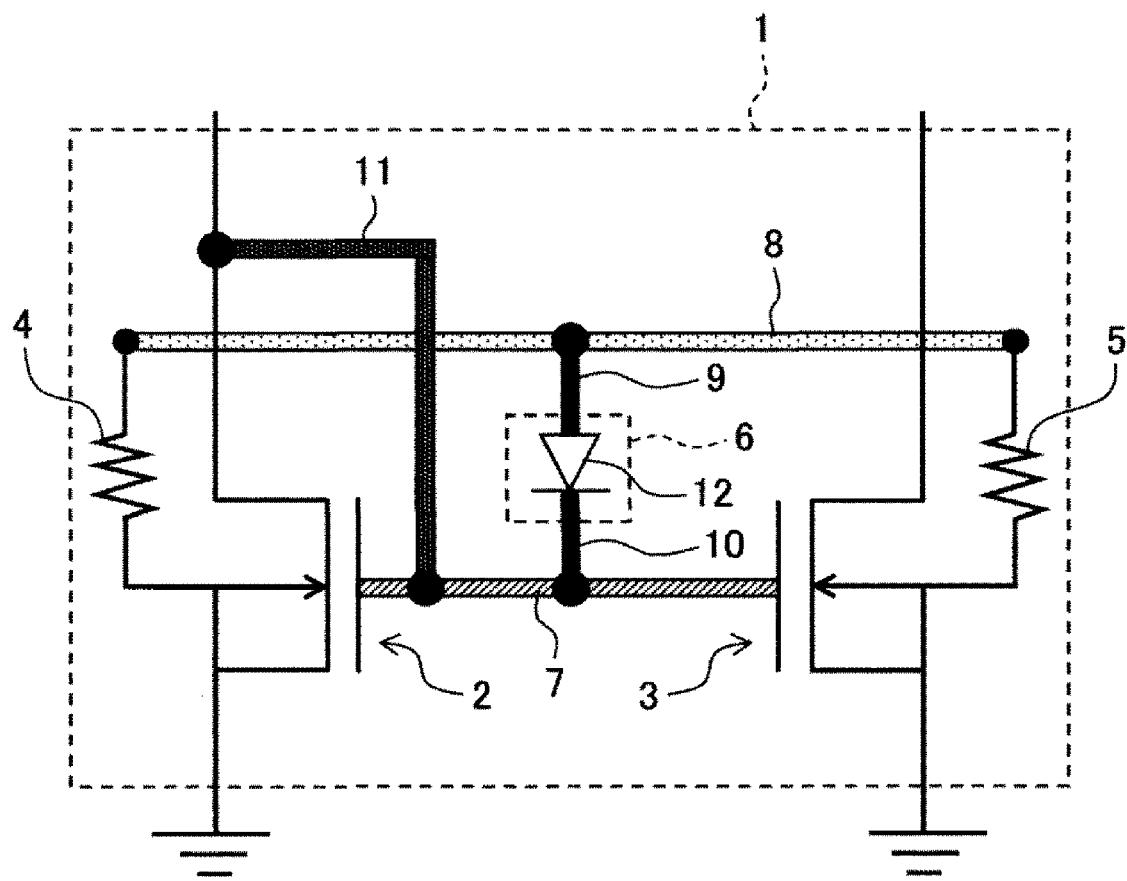
FIG. 2 is a circuit diagram showing a specific example of the semiconductor integrated circuit device according to Example 1.
Figure 3:
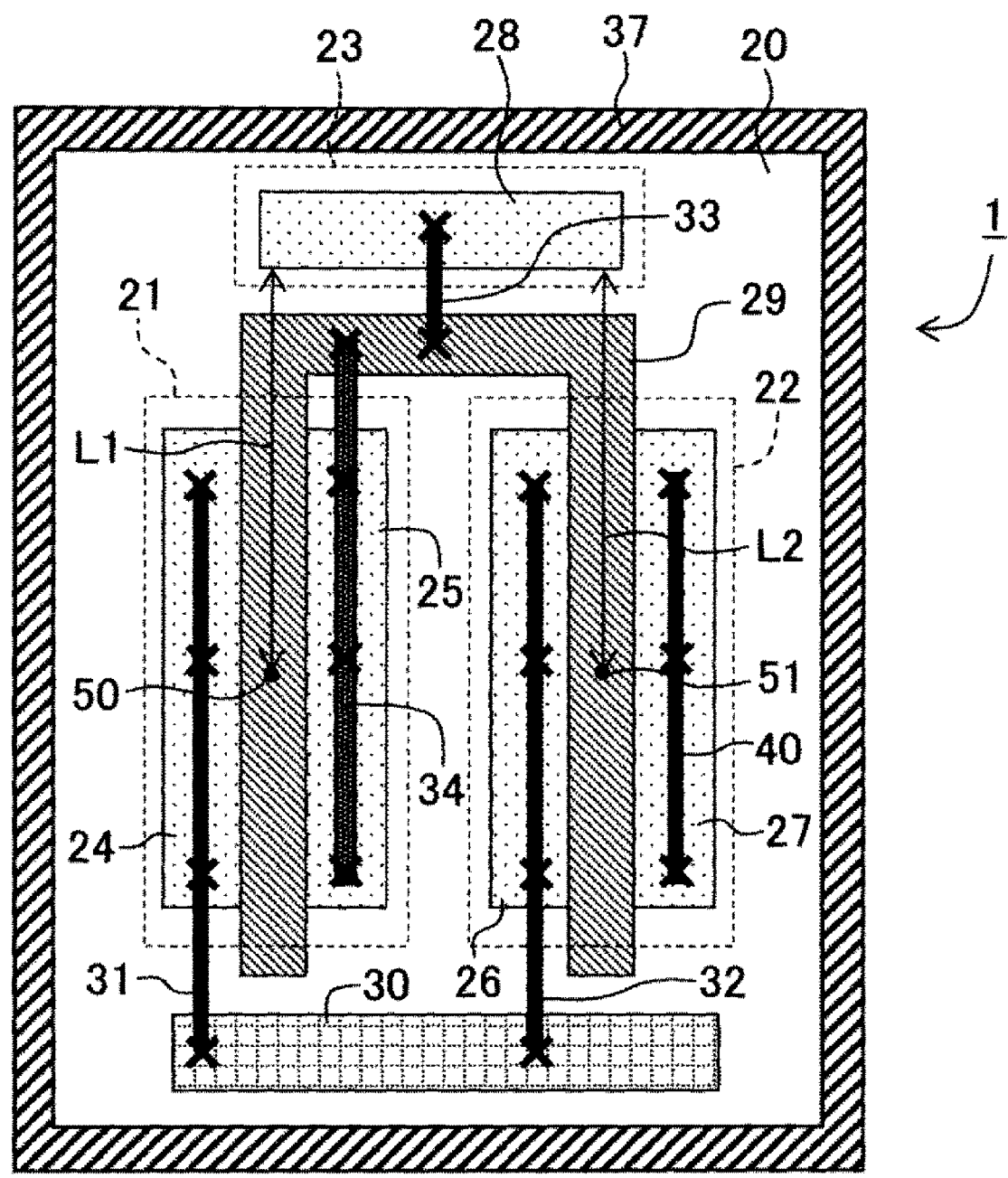
FIG. 3 is a diagram showing an example of a plan structure of the semiconductor integrated circuit device according to Example 1.
Figure 4:
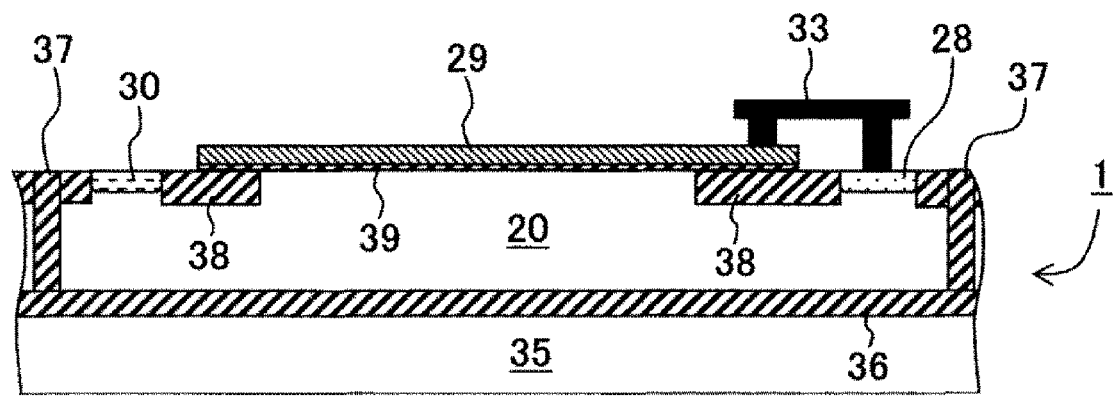
FIG. 4 is a diagram showing an example of a cross-sectional structure of the semiconductor integrated circuit device according to Example 1.
Figure 5:
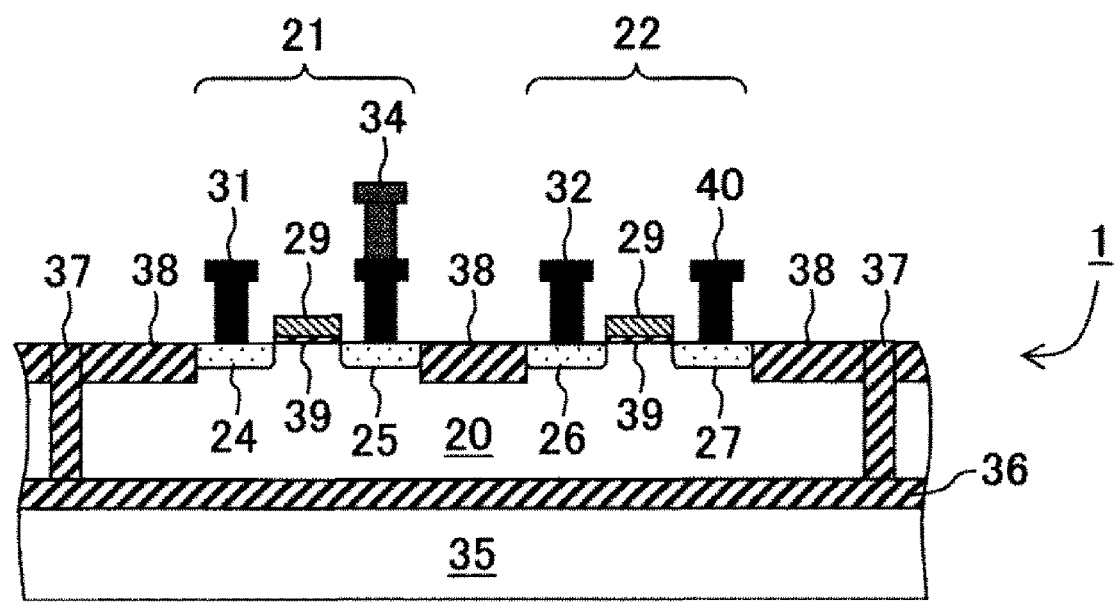
FIG. 5 is a diagram showing an example of the cross-sectional structure of the semiconductor integrated circuit device according to Example 1.

FIG. 2 is a circuit diagram showing a specific example of a semiconductor integrated circuit device according to the present example. FIG. 3 is a diagram showing an example of a plan structure of the semiconductor integrated circuit device, and FIGS. 4 and 5 are diagrams showing an example of a cross-sectional structure of the semiconductor integrated circuit device, respectively.

In FIG. 2, the current mirror circuit 1, which is the semiconductor integrated circuit device according to the present example, includes the NMOS-type transistor 2 on the side where the bias is generated, and the NMOS-type transistor 3 on a side where the bias generated by the NMOS-type transistor 2 is received. The gate electrodes of the NMOS-type transistors 2 and 3 are connected via the first connection line 7 formed below the first wiring layer, and the wells are connected via the second connection line 8 below the first wiring layer. Further, the gate electrode and the drain of the NMOS-type transistor 2 on the side where the bias is generated are connected via the connection line 11 formed in a second wiring layer above the first wiring layer. The resistances of the wells of the NMOS-type transistors 2 and 3 are indicated by the P-well resistances 4 and 5 connected via the second connection line 8. Further, the first connection line 7 is formed of a polysilicon layer forming the gate electrode, and the second connection line 8 is formed of a P-type semiconductor layer forming a P-well layer. Further, the connection circuit 6 is connected between the gate electrode and the well of the NMOS-type transistor 2 and between the gate electrode and the well of the NMOS-type transistor 3 that receives the bias via the connection lines 9 and 10 formed in the first wiring layer without through a semiconductor substrate. That is, the first connection line 7 that connects the gate electrodes of the NMOS-type transistors 2 and 3 and the connection circuit 6 are connected via the connection line 10, and the second connection line 8 that connects the wells and the connection circuit 6 are connected via the connection line 9.

The connection circuit 6 makes the gate electrodes and the wells of the NMOS-type transistors 2 and 3 in an electrically short-circuited state during the manufacturing of the current mirror circuit 1 which is the semiconductor integrated circuit device, and makes the gate electrodes and the wells of the NMOS-type transistors 2 and 3 in a disconnected state in at least one direction during a mounting operation. Specifically, the connection circuit 6 includes a diode 12 connected between the first connection line 7 and the second connection line 8. The diode 12 of the connection circuit 6 has an anode side connected to the second connection line 8 (that is, well sides of the NMOS-type transistors 2 and 3) via the connection line 9, and a cathode side connected to the first connection line 7 (that is, gate electrode sides of the NMOS-type transistors 2 and 3) via the connection line 10.

Accordingly, for example, when the first connection line 7 connected to the gate electrodes of the NMOS-type transistors 2 and 3 is relatively negatively charged due to the influence of plasma with respect to the second connection line 8 connected to the wells thereof, a current flows through the diode 12 in a forward direction. On the other hand, when the first connection line 7 is charged opposite to the above, that is, when the first connection line 7 is positively charged with respect to the second connection line 8, a voltage is applied to the diode 12 in an opposite direction, and when the voltage is equal to or higher than a withstand voltage in the opposite direction, a breakdown current flows and the voltage is clamped constant.

As shown in FIGS. 3 to 5, in the current mirror circuit 1 which is the semiconductor integrated circuit device, a NMOS-type transistor 21 on a side where a bias is generated (corresponding to the NMOS-type transistor 2 in FIG. 2) and a NMOS-type transistor 22 on a side where the bias is received (corresponding to the NMOS-type transistor 3 in FIG. 2) are in a same P-well region 20 on an oxide film 36 formed on a semiconductor (silicon on insulator (SOI)) substrate 35, and the P-well region 20 is the second connection line 8. Gate electrodes 29 of the NMOS-type transistors 21 and 22 are formed of a poly-Si layer separated by a shallow trench isolation (STI) 38 and a gate electrode oxide film 39 on the P-well region 20, and are structurally connected to each other via the first connection line 7 formed integrally with the gate electrode 29 with the same poly-Si layer. The gate electrode 29 and a drain 25 of the NMOS-type transistor 21 on the side where the bias is generated are connected via a connection line 34 (corresponding to the connection line 11) formed in a second wiring layer above the first wiring layer. A PN junction diode 23 (corresponding to the diode 12 in FIG. 2) as the connection circuit 6 is formed of an N-type semiconductor layer 28 serving as a cathode (N+) and the P-well region 20 serving as an anode. The N-type semiconductor layer 28 (cathode (N+)) of the PN junction diode 23 and the first connection line 7 are connected via a connection line 33 of the first wiring layer. Sources (N+) 24 and 26 of the NMOS-type transistors 21 and 22 and a P-well power supply (P+) are connected via connection lines 31 and 32 of the first wiring layer, respectively. On a drain (N+) 27 of the NMOS-type transistor 22 on the side where the bias is received, a connection wiring 40 used for connection with another semiconductor element or circuit formed on the semiconductor substrate 35 is formed. The current mirror circuit 1 is surrounded by a trench groove 37 formed of an insulating film embedded in the semiconductor substrate 35 so as to be separated from other circuits formed on the semiconductor substrate 35.

Herein, the PN junction diode 23 is disposed such that distances L1 and L2 to centers of gravity 50 and 51 of the channel regions of the NMOS-type transistors 21 and 22 are equal to each other, and the well resistances 4 and 5 are disposed equal to each other.

Other configurations are the same as those in the first embodiment.

In the present example configured as above, an effect similar to that in the first embodiment can be obtained.

Further, in the present example, even when an RC delay time occurs due to the influence of the plasma charging due to the well resistances 4 and 5 and a parasitic capacitance, a voltage of the channel region can be made equal between the NMOS-type transistors 21 and 22. Therefore, since an amount of change in the electrical characteristics of the NMOS-type transistors 21 and 22 can be made equal, high current accuracy can be ensured. Further, since the diode 12 (PN junction diode 23) of the connection circuit 6 does not have to be provided in each of the NMOS-type transistors 21 and 22 and can be shared, a chip area can be reduced.

Second Embodiment

A second embodiment of the invention will be described with reference to FIG. 6. In the present embodiment, only differences from the first embodiment are described, and similar members as those in the first embodiment in the drawings used in the present embodiment are denoted by the same reference numerals and description thereof will be omitted.

In the present embodiment, the current mirror circuit 1 which is the semiconductor integrated circuit device includes a control line 15 for supplying a VDD power supply voltage to connection circuit 6 during an operation thereof.

Figure 6:
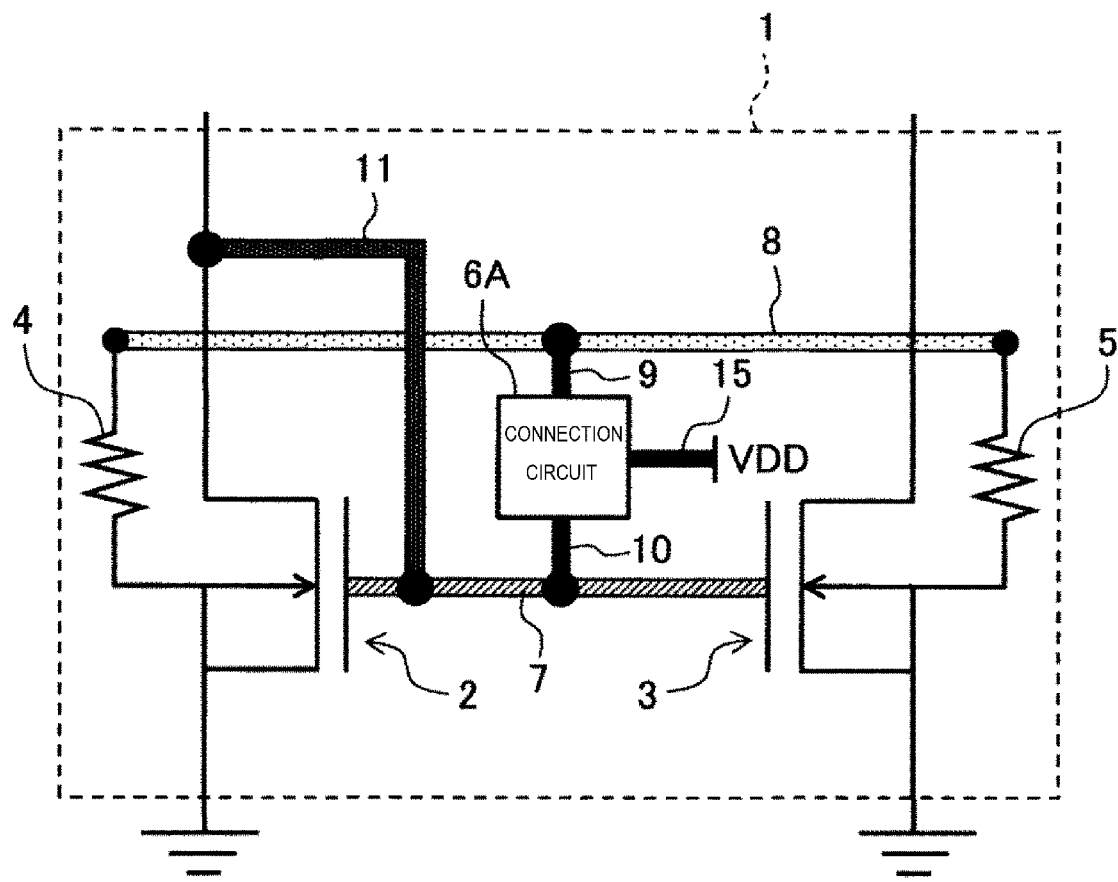
FIG. 6 is a circuit diagram showing an example of a semiconductor integrated circuit device according to a second embodiment.

FIG. 6 is a circuit diagram showing an example of the semiconductor integrated circuit device according to the present embodiment.

In FIG. 6, the current mirror circuit 1, which is the semiconductor integrated circuit device according to the present embodiment, includes the NMOS-type transistor 2 on the side where the bias is generated, and the NMOS-type transistor 3 on the side where the bias generated by the NMOS-type transistor 2 is received. The gate electrodes of the NMOS-type transistors 2 and 3 are connected via the first connection line 7 formed below the first wiring layer, and the wells are connected via the second connection line 8 below the first wiring layer. Further, the gate electrode and the drain of the NMOS-type transistor 2 on the side where the bias is generated are connected via the connection line 11 formed in the second wiring layer above the first wiring layer. The resistances of the wells of the NMOS-type transistors 2 and 3 are indicated by the P-well resistances 4 and 5 connected via the second connection line 8. Further, the first connection line 7 is formed of a polysilicon layer forming the gate electrode, and the second connection line 8 is formed of a P-type semiconductor layer forming a P-well layer.

A connection circuit 6A is connected between the gate electrode and the well of the NMOS-type transistor 2 and between the gate electrode and the well of the NMOS-type transistor 3 that receives the bias via the connection lines 9 and 10 formed in the first wiring layer without through a semiconductor substrate. That is, the first connection line 7 that connects the gate electrodes of the NMOS-type transistors 2 and 3 and the connection circuit 6A are connected via the connection line 10, and the second connection line 8 that connects the wells and the connection circuit 6A are connected via the connection line 9.

The control line 15 is added to the connection circuit 6A, and the control line 15 is configured to be supplied with the VDD power supply voltage when the current mirror circuit 1, which is the semiconductor integrated circuit device, operates. On the other hand, the connection circuit 6A is configured to make the gate electrode and the well of each of the NMOS-type transistors 2 and 3 in an short-circuited state when the control line 15 is in a floating state, and to apply a voltage difference between the gate electrode and the well such that a current flows through each of the NMOS-type transistors 2 and 3, that is, to make the gate electrode and the well in a non-conductive state in at least one direction when the control line 15 is at a VDD potential.

Other configurations are the same as those in the first embodiment and Example 1.

In the present embodiment configured as above, an effect similar to that in the first embodiment can be obtained.

Further, in a manufacturing process after a process of forming the first wiring layer, since the gate electrode and the well are in the short-circuited state, the voltage difference generated between the gate electrode and the channel region due to the influence of the plasma charging can be eliminated.

Example 2

Another example of the invention will be described with reference to FIGS. 7 and 8.

Figure 7:
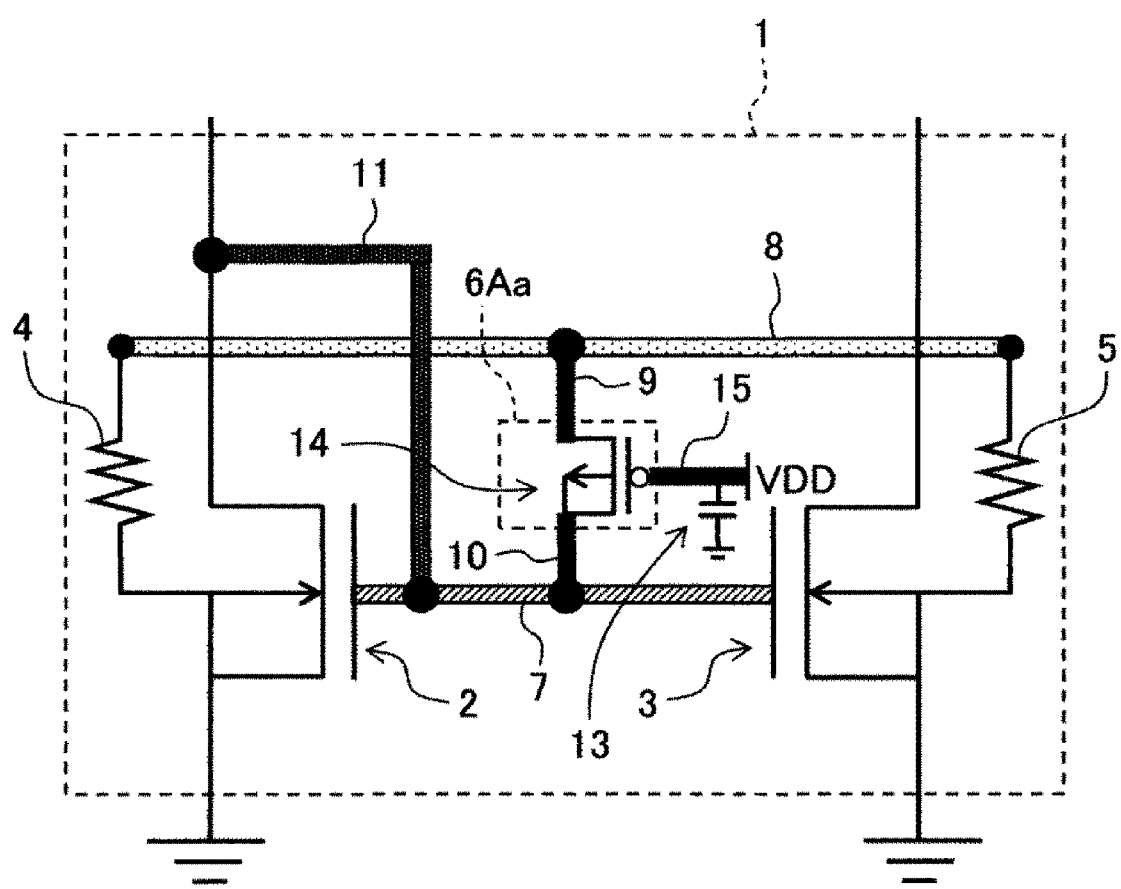
FIG. 7 is a circuit diagram showing a specific example of the semiconductor integrated circuit device according to Example 2.

FIG. 7 is a circuit diagram showing a specific example of a semiconductor integrated circuit device according to the present example.

In FIG. 7, the current mirror circuit 1, which is the semiconductor integrated circuit device according to the present example, includes the NMOS-type transistor 2 on the side where the bias is generated, and the NMOS-type transistor 3 on the side where the bias generated by the NMOS-type transistor 2 is received. The gate electrodes of the NMOS-type transistors 2 and 3 are connected via the first connection line 7 formed below the first wiring layer, and the wells are connected via the second connection line 8 below the first wiring layer. Further, the gate electrode and the drain of the NMOS-type transistor 2 on the side where the bias is generated are connected via the connection line 11 formed in the second wiring layer above the first wiring layer. The resistances of the wells of the NMOS-type transistors 2 and 3 are indicated by the P-well resistances 4 and 5 connected via the second connection line 8. Further, the first connection line 7 is formed of a polysilicon layer forming the gate electrode, and the second connection line 8 is formed of a P-type semiconductor layer forming a P-well layer.

A connection circuit 6Aa is connected between the gate electrode and the well of the NMOS-type transistor 2 and between the gate electrode and the well of the NMOS-type transistor 3 that receives the bias via the connection lines 9 and 10 formed in the first wiring layer without through a semiconductor substrate. That is, the first connection line 7 that connects the gate electrodes of the NMOS-type transistors 2 and 3 and the connection circuit 6Aa are connected via the connection line 10, and the second connection line 8 that connects the wells and the connection circuit 6Aa are connected via the connection line 9.

The connection circuit 6Aa includes a depletion-type PMOS-type transistor 14, a source of the PMOS-type transistor 14 is connected to each gate electrode of the NMOS-type transistors 2 and 3, a drain thereof is connected to each well of the NMOS-type transistors 2 and 3, and a gate thereof is connected to the control line 15 connected to a parasitic capacitance 13.

The parasitic capacitance 13 connected to the gate electrode of the depletion-type PMOS-type transistor 14 is provided such that a potential of the gate electrode does not change due to the plasma charging, and has a PN junction capacitance, an oxide film capacitance, and the like of a device connected to a VDD power supply line.

In the present example configured as above, when the first connection line 7 connected to the gate electrode is positively charged due to the influence of the plasma charging with respect to the second connection line 8 connected to the well, since the depletion-type PMOS-type transistor 14 is in a normally-on state, there is no potential difference between the gate electrode and the well. On the contrary, when the first connection line 7 connected to the gate electrode is negatively charged with respect to the second connection line 8 connected to the well, a PN junction diode formed between the drain and the source of the depletion-type PMOS-type transistor 14 and N-wells connected thereto is in a forward direction conductive state, and similarly, the potential difference between the gate electrode and the well is reduced.

As a result, since the voltage difference between the gate electrode and the channel region can be further reduced compared to the current mirror circuit 1 which is the semiconductor integrated circuit device in Example 1, the influence of the plasma charging on each of the NMOS-type transistors 2 and 3 can be further controlled. Therefore, a change in electrical characteristics of the NMOS-type transistors 2 and 3 can be further reduced, and the high current accuracy can be ensured in the current mirror circuit 1.

Figure 8:
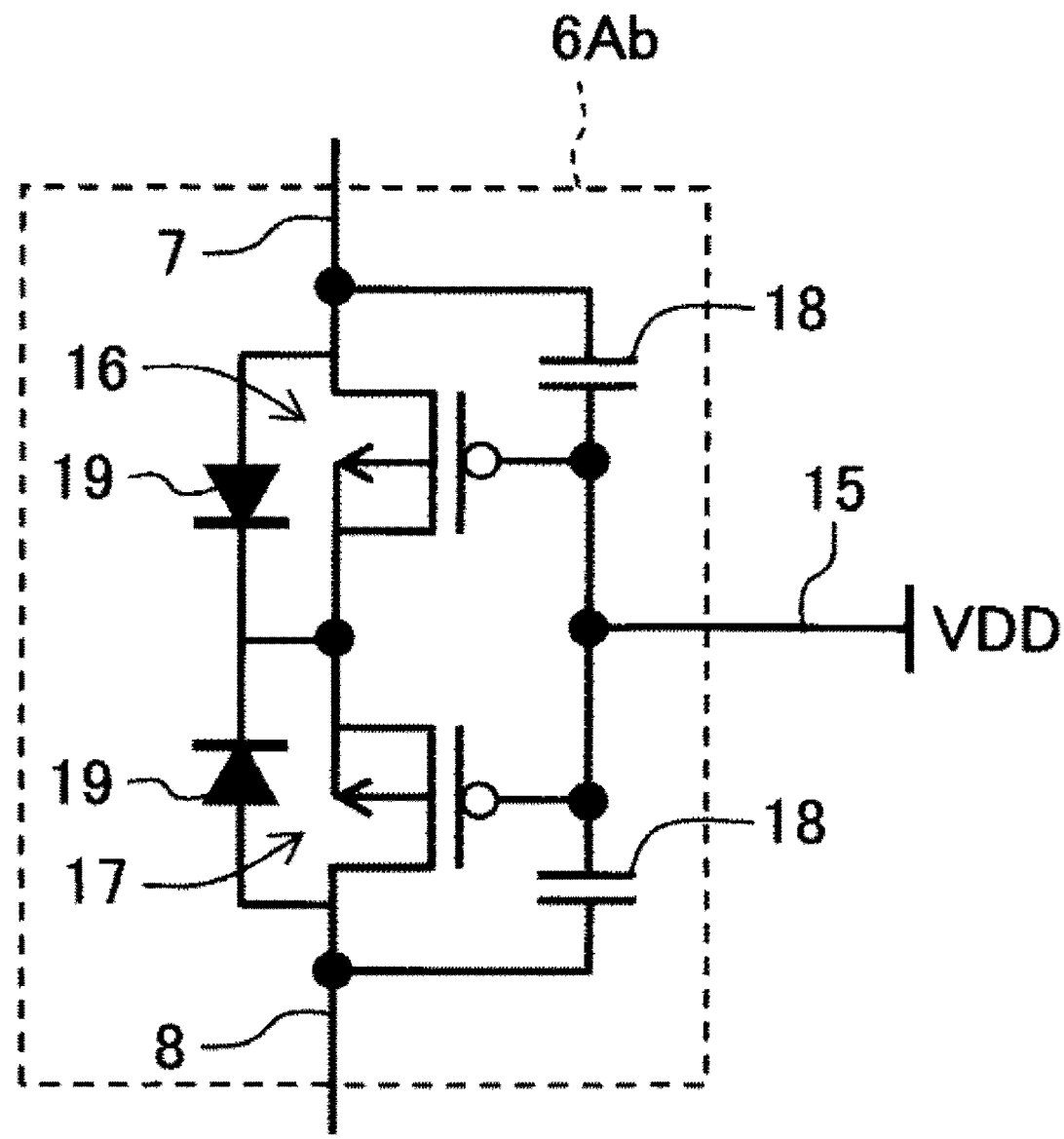
FIG. 8 is a circuit diagram showing another specific example of the connection circuit in the semiconductor integrated circuit device according to the example 2.

FIG. 8 is a circuit diagram showing another specific example of the connection circuit in the semiconductor integrated circuit device according to the present example.

In FIG. 8, a connection circuit 6Ab includes two PMOS-type transistors 16 and 17, and sources of the PMOS-type transistors 16 and 17 are connected to each other, gates thereof are connected to each other via the control line 15 and a power supply voltage VDD is supplied. Further, in the PMOS-type transistors 16 and 17 of the connection circuit 6Ab, a drain of the PMOS-type transistor 16 is connected to the first connection line 7, and a drain of the PMOS-type transistor 17 is connected to the second connection line 8. Further, capacitive elements 18 are connected between the gates and the drains, respectively.

Herein, the operation of the connection circuit 6Ab in the present example will be described in detail.

During the manufacturing of the current mirror circuit 1 which is the semiconductor integrated circuit device of the present example, when the first connection line 7 is a positive potential V1 with respect to the second connection line 8 due to the influence of plasma, a diode 19 connected in parallel to the PMOS-type transistor 16 of the connection circuit 6Ab is a forward bias (Vf). At this time, a potential of the control line 15 is V1/2 obtained by dividing with the capacitive element 18 with respect to the second connection line 8. A voltage between the gate and the source of the PMOS-type transistor 17 is Vf-V1/2, and when the voltage is equal to or lower than a threshold voltage of the PMOS-type transistor 16, a conductive state is obtained, and the first connection line 7 and the second connection line 8 are electrically connected. For example, when Vf=V and the threshold voltage=−0.8 V, V1 is 3.0 V.

On the contrary, when the first connection line 7 is a negative potential V2 with respect to the second connection line 8, the diode 19 connected in parallel to the PMOS-type transistor 17 is the forward bias (Vf). At this time, the potential of the control line 15 is V2/2 obtained by dividing with the capacitive element 18 with respect to the second connection line 8. The voltage between the gate and the source of the PMOS-type transistor 16 is Vf+V2/2, and when the voltage is equal to or lower than a threshold voltage of the PMOS-type transistor 17, a conductive state is obtained, and the first connection line 7 and the second connection line 8 are electrically connected. For example, when Vf=0.7 V and the threshold voltage=−0.8 V, V2 is −3.0 V.

On the other hand, when the current mirror circuit 1, which is the semiconductor integrated circuit device, operates, since a power supply voltage VDD of, for example, 5 V is applied to the control line 15, the connection circuit 6Ab is always in the non-conductive state. In the present example, it is desirable that the potential of the control line 15 be at an intermediate potential between the first connection line 7 and the second connection line 8, and it is desirable that the parasitic capacitance connected to the control line 15 be smaller than a capacitance of the capacitive element 18. Therefore, it is desirable that the control line 15 is connected to a power supply voltage VDD line via a wiring layer as high as possible.

In the present example configured as above, regardless of an absolute potential of the first connection line 7 and the second connection line 8, when a certain potential difference is generated between the connection lines, conductive connection can be performed. Therefore, when the connection circuit 6Aa (see FIG. 7) is used, when both the first connection line 7 and the second connection line 8 are negatively charged, the conductive connection cannot be performed, but in the present example, even when both the first connection line 7 and the second connection line 8 are negatively charged, if the potential difference exceeds a certain value, the connection circuit can be brought into a conductive state.

Example 3

Another example of the invention will be described with reference to FIG. 9. In the present example, only differences from Example 2 are described, and similar members as those in Example 2 in the drawings used in the present example are denoted by the same reference numerals and description thereof will be omitted.

The present example shows a case where a current mirror circuit 1B includes PMOS-type transistors 61 and 62, a potential of a source thereof is always higher than a potential of a drain thereof, and the connection circuit 6Aa of Example 2 is used.

Figure 9:
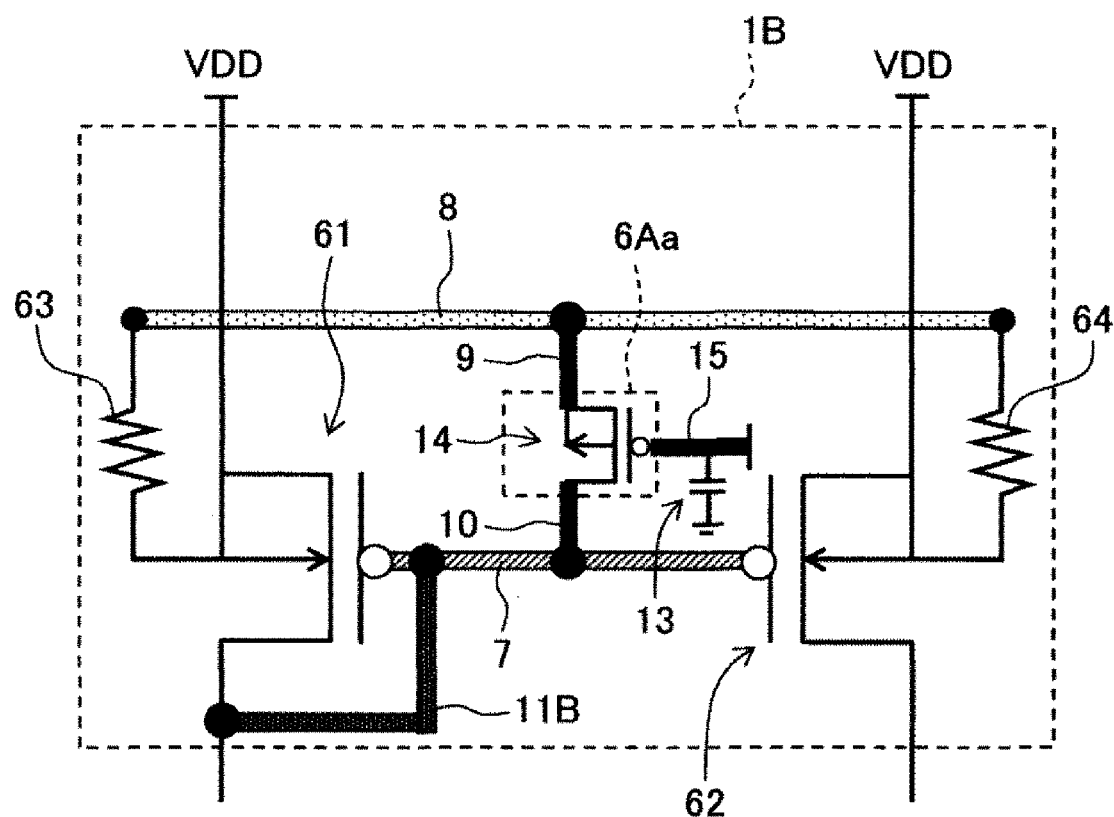
FIG. 9 is a circuit diagram showing an example of a semiconductor integrated circuit device according to Example 3.

FIG. 9 is a circuit diagram showing an example of a semiconductor integrated circuit device according to the present example.

In FIG. 9, the current mirror circuit 1B, which is the semiconductor integrated circuit device according to the present embodiment, includes the PMOS-type transistor 61 on the side where the bias is generated, and the PMOS-type transistor 62 on the side where the bias generated by the PMOS-type transistor 61 is received. The gate electrodes of the PMOS-type transistors 61 and 62 are connected via the first connection line 7, and the wells are connected via the second connection line 8. Further, the gate electrode and the source of the PMOS-type transistor 61 on the side where the bias is generated are connected via a connection line 11B formed in the second wiring layer. The resistances of the wells of the PMOS-type transistors 61 and 62 are indicated by N-well resistances 63 and 64 connected via the second connection line 8. The connection circuit 6Aa is connected between the gate electrode and the well of the PMOS-type transistor 61 and between the gate electrode and the well of the PMOS-type transistor 61 that receives the bias via the connection lines 9 and 10 formed in the first wiring layer without through a semiconductor substrate. That is, the first connection line 7 that connects the gate electrodes of the PMOS-type transistors 61 and 62 and the connection circuit 6Aa are connected via the connection line 10, and the second connection line 8 that connects the wells and the connection circuit 6Aa are connected via the connection line 9.

In the present example, the connection circuit 6Aa (see FIG. 7) including the depletion-type PMOS-type transistor 14 is used as an example, whereas the invention is not limited thereto, and the connection circuit 6Ab (see FIG. 8) may be used. Instead of the connection circuit 6Aa, the connection circuit 6 (see FIG. 2) using the diode 12 (PN junction diode) can be used. At this time, since the gate electrodes of the PMOS-type transistors 61 and 62 can be applied with a negative voltage with respect to the channel region, an anode is connected to the first connection line 7 connected to the gate electrode, and a cathode is connected to the second connection line 8 connected to the N-well.

Third Embodiment

A third embodiment of the invention will be described with reference to FIG. 10. In the present embodiment, only differences from the above-described embodiments and examples are described, and similar members as those in the above-described embodiments and examples in the drawings used in the present embodiment are denoted by the same reference numerals and description thereof will be omitted.

The present embodiment shows a current control device including a current mirror circuit which is a semiconductor integrated circuit device according to each of the above-described embodiments and examples.

Figure 10:
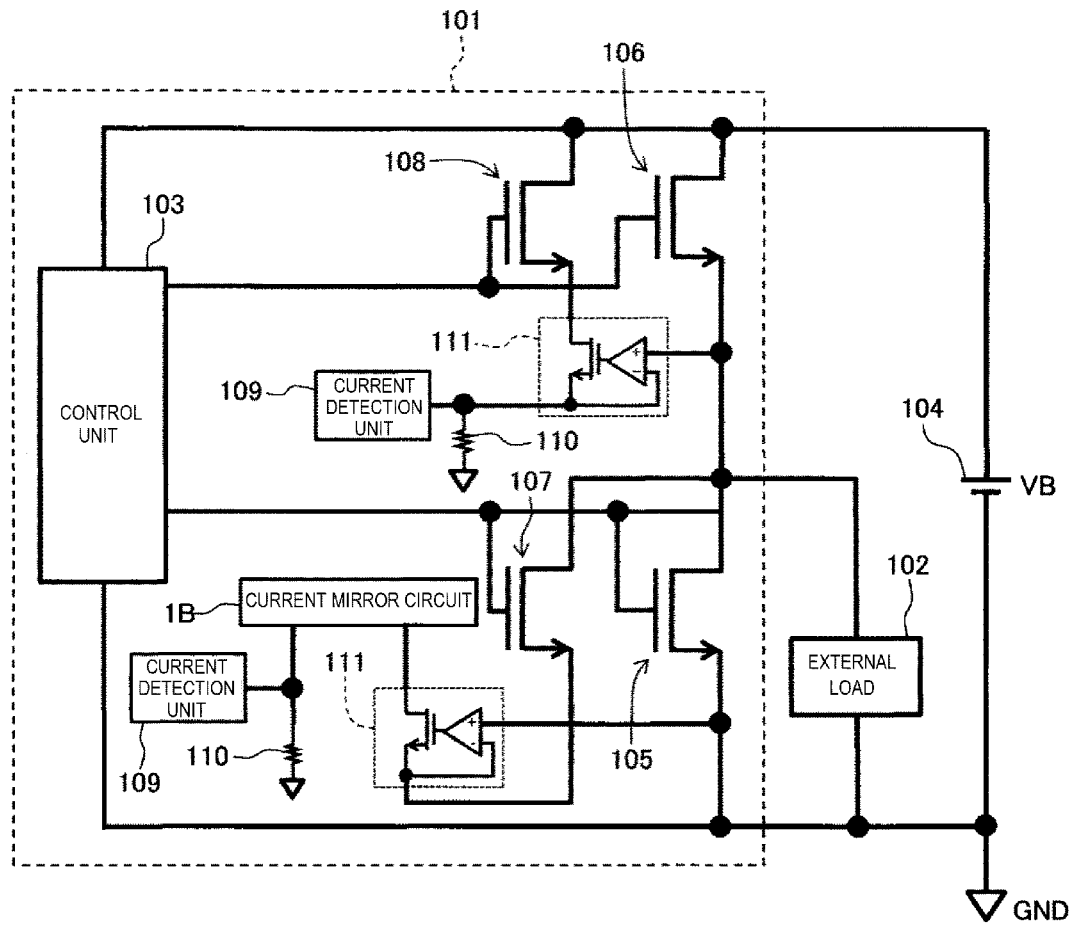
FIG. 10 is a circuit diagram showing an example of a current control device according to a third embodiment.

FIG. 10 is a circuit diagram showing an example of the current control device according to the present embodiment.

In FIG. 10, a current control device 101 schematically includes main MOS-type transistors 105 and 106 that drive a current flowing to an external load 102, sense MOS-type transistors 107 and 108 connected in parallel to the main MOS-type transistors 105 and 106 to perform current detection, a resistance element 110 that converts a current flowing through the sense MOS-type transistors 107 and 108 into a voltage, and a current detection unit 109 that measures a voltage value of the resistance element 110 and detects a current.

A virtual short circuit 111 is connected to source electrodes of the sense MOS-type transistors 107 and 108 so as to virtually short-circuit source electrodes of the main MOS-type transistors 105 and 106, and the low-side sense MOS-type transistor 107 is connected to the resistance element 110 via the current mirror circuit 1. Further, gate electrodes of the main MOS-type transistors 105 and 106 and gate electrodes of the sense MOS-type transistors 107 and 108 are connected to a control unit 103.

The current mirror circuit 1B includes a PMOS-type transistor (see, for example, FIG. 9 and the like), a PMOS-type transistor on a side where a bias is generated is connected to the low-side sense MOS-type transistor 107, and a PMOS-type transistor on a side where the bias is received is connected to the resistance element 110. The current mirror circuit 1B causes a current having a current amount same as that of the low-side sense MOS-type transistor 107 flow to the resistance element 110 by, and a current value thereof is detected by the current detection unit 109.

Herein, in the high-side sense MOS-type transistor 108, when the transistor is in an ON state and the current flows from the drain to the source, the current flowing through the resistance element 110 is detected by the current detection unit 109. On the other hand, in the low-side sense MOS-type transistor 107, when the transistor is in an off state and a ring flow current from the external load flows from the source to the drain, the current generated by the current mirror circuit 1B flows through the resistance element 110, and the current is detected by the current detection unit 109.

A drive current (ILOAD) flowing through the main MOS-type transistors 105 and 106 is obtained by multiplying a current (ISense) flowing through the sense MOS-type transistors 107 and 108 by a certain ratio (sense ratio), and when an offset current (Ioffset) is present in the current mirror circuit 1B, the drive current causes an error of a value obtained by multiplying the offset current by the sense ratio. As a result, a difference occurs between the drive current value detected in the ON state of the high-site main MOS-type transistor 106 and the drive current value detected in the ring flow state from the ON state to the OFF state of the high-side main MOS-type transistor 106.

However, in the current mirror circuit 1B according to the present embodiment, since the influence of the plasma in the wiring process can be controlled, the offset current can be controlled, and an observation error of the drive current can be reduced. As a result, in the current control device 101 using the current mirror circuit 1B of the present embodiment, the current accuracy of the drive current can be ensured.

Fourth Embodiment

A fourth embodiment of the invention will be described with reference to FIG. 11. In the present embodiment, only differences from the above-described embodiments and examples are described, and similar members as those in each of the above-described embodiments and examples in the drawings used in the present embodiment are denoted by the same reference numerals and description thereof will be omitted.

The present embodiment shows an automatic transmission control device for a vehicle including the current control device according to the third embodiment.

Figure 11:
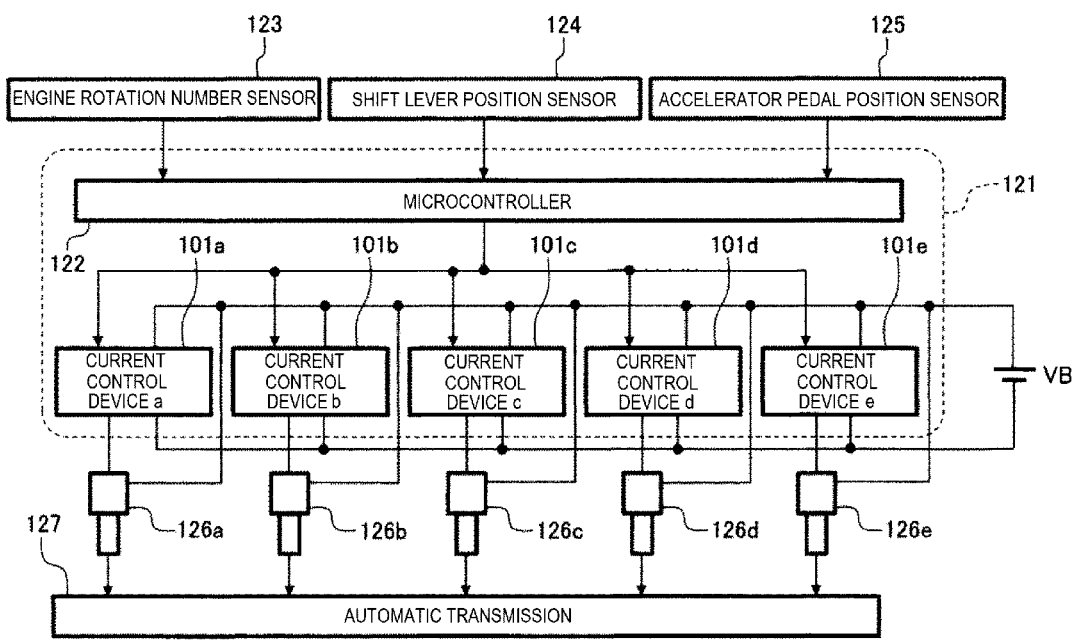
FIG. 11 is a diagram showing an example of an automatic transmission control device according to a fourth embodiment.

FIG. 11 is a diagram showing an example of the automatic transmission control device according to the present embodiment.

In FIG. 11, an automatic transmission control device 121 includes a plurality of current control devices 101 and a microcontroller 122 that controls the plurality of current control devices 101. The microcontroller 122 receives a signal from a sensor group including an engine rotation sensor 123, a shift lever position sensor 124, and an accelerator pedal position sensor 125 and calculates an optimal gear ratio. Further, a solenoid 126 controls a clutch in a transmission by hydraulic pressure, and is current-controlled by the current control device 101.

In the present embodiment configured as above, since the current control device 101 with high current accuracy of the drive current is used, it is possible to perform automatic transmission control with higher accuracy and higher reliability.

NOTES

The invention is not limited to the above-described embodiments, and includes various modifications and combinations without departing from the scope thereof. Further, the invention is not limited to a configuration including all the configurations described in the above embodiments, and includes a configuration in which a part of the configuration is deleted.

REFERENCE SIGN LIST 1, 1B current mirror circuit
2, 3 NMOS-type transistor
4, 5 well resistance
6, 6A, 6Aa, 6Ab connection circuit
7 first connection line
8 second connection line
9, 10, 11, 11B, 12 diode
13 parasitic capacitance
14 PMOS-type transistor
15 control line
16 PMOS-type transistor
17 PMOS-type transistor
18 capacitive element
19 diode
20 well region
21, 22 NMOS-type transistor
23 junction diode
24 source (N+)
25 drain
26 source (N+)
27 drain (N+)
28 N-type semiconductor layer
29 gate electrode
31 to 34 connection line
35 semiconductor substrate
36 oxide film
37 trench groove
39 gate electrode oxide film
40 connection wiring
50, 51 center of gravity
61, 62 PMOS-type transistor
63, 64 well resistance
71, 72 MOS-type transistor group
73, 74 diode
75 metal wiring
101 current control device
102 external load
103 control unit
105, 106 main MOS-type transistor
107, 108 sense MOS-type transistor
109 current detection unit
110 resistance element
111 virtual short circuit
121 automatic transmission control device
122 microcontroller
123 engine rotation sensor
124 shift lever position sensor
125 accelerator pedal position sensor
126 solenoid

The invention claimed is:

1. A semiconductor integrated circuit device formed on a semiconductor substrate, the semiconductor integrated circuit device comprising:
a current mirror circuit on which both of a well of a MOS-type transistor that generates a bias and a well of a MOS-type transistor that receives the bias are formed insulated and separated from the semiconductor substrate; and
a connection circuit that is connected via a first wiring layer between a gate electrode and the well of the MOS-type transistor that generates the bias, and between a gate electrode and the well of the MOS-type transistor that receives the bias without through the semiconductor substrate, wherein
the connection circuit makes the gate electrode and the well in an electrically short-circuited state during manufacturing of the semiconductor integrated circuit device, and makes the gate electrode and the well in a disconnected state in at least one direction during a mounting operation, wherein
the gate electrode of the MOS-type transistor that generates the bias and the gate electrode of the MOS-type transistor that receives the bias are connected via a first wiring layer below the first wiring layer, and
the well of the MOS-type transistor that generates the bias and the well of the MOS-type transistor that receives the bias are connected via a second wiring layer below the first wiring layer.

2. The semiconductor integrated circuit device according to claim 1, wherein
the gate electrode and a drain of the MOS-type transistor that generates the bias are connected via a second wiring layer above the first wiring layer.

3. The semiconductor integrated circuit device according to claim 2, wherein
the first wiring layer includes a layer that generates the gate electrode, and the second wiring layer includes a layer that forms the well.

4. The semiconductor integrated circuit device according to claim 3, wherein
when a distance between the connection circuit and a center of gravity of a channel region of the MOS-type transistor that generates the bias is set to a first distance L1, and a distance between the connection circuit and a center of gravity of a channel region of the MOS-type transistor that receives the bias is set to a second distance L2, the distance L1 and the distance L2 are substantially equal.

5. A current control device, comprising:
a main MOS-type transistor formed on a semiconductor substrate and configured to drive a current;
a sense MOS-type transistor connected in parallel to the main MOS-type transistor and configured to perform current detection on the main MOS-type transistor;
the current mirror circuit of the semiconductor integrated circuit device according to claim 1 connected to the sense MOS-type transistor;
a resistance element connected to the current mirror circuit; and
a detector configured to detect a current flowing through the resistance element, wherein
both of a well of a MOS-type transistor that generates a bias and constitutes the current mirror circuit and a well of a MOS-type transistor that receives the bias are insulated and separated from the semiconductor substrate.

6. An automatic transmission control device, comprising:
the current control device according to claim 5; and
a microcontroller configured to control the current control device.

7. A semiconductor integrated circuit device formed on a semiconductor substrate, the semiconductor integrated circuit device comprising:
 a current mirror circuit on which both of a well of a MOS-type transistor that generates a bias and a well of a MOS-type transistor that receives the bias are formed insulated and separated from the semiconductor substrate; and
 a connection circuit that is connected via a first wiring layer between a gate electrode and the well of the MOS-type transistor that generates the bias, and between a gate electrode and the well of the MOS-type transistor that receives the bias without through the semiconductor substrate, wherein
 the connection circuit makes the gate electrode and the well in an electrically short-circuited state during manufacturing of the semiconductor integrated circuit device, and makes the gate electrode and the well in a disconnected state in at least one direction during a mounting operation;
wherein
 the connection circuit includes a control line connected to a semiconductor layer via the first wiring layer, and
 the control line is supplied with a predetermined voltage during the mounting operation of the semiconductor integrated circuit device.

8. The semiconductor integrated circuit device according to claim 7, wherein
 the control line is connected to a power supply line formed on the semiconductor substrate.

9. The semiconductor integrated circuit device according to claim 7, wherein the connection circuit includes a depletion-type MOS-type transistor.

10. The semiconductor integrated circuit device according to claim 7, wherein
 the connection circuit includes two MOS-type transistors in which source electrodes are connected to each other and gate electrodes are connected to each other.

11. A semiconductor integrated circuit device formed on a semiconductor substrate, the semiconductor integrated circuit device comprising:
 a current mirror circuit on which both of a well of a MOS-type transistor that generates a bias and a well of a MOS-type transistor that receives the bias are formed insulated and separated from the semiconductor substrate; and
 a connection circuit that is connected via a first wiring layer between a gate electrode and the well of the MOS-type transistor that generates the bias, and between a gate electrode and the well of the MOS-type transistor that receives the bias without through the semiconductor substrate, wherein
 the connection circuit makes the gate electrode and the well in an electrically short-circuited state during manufacturing of the semiconductor integrated circuit device, and makes the gate electrode and the well in a disconnected state in at least one direction during a mounting operation;
wherein
 the semiconductor substrate is an SOI substrate, and the current mirror circuit is formed on the SOI substrate, and
 a trench groove that is formed of an insulating film embedded in the SOI substrate and that separates the current mirror circuit from other circuits is included.

* * * * *